United States Patent
Sur, Jr. et al.

[11] Patent Number: 6,143,642
[45] Date of Patent: *Nov. 7, 2000

[54] PROGRAMMABLE SEMICONDUCTOR STRUCTURES AND METHODS FOR MAKING THE SAME

[75] Inventors: Harlan Lee Sur, Jr., San Leandro; Subhas Bothra, San Jose, both of Calif.

[73] Assignee: VLSI Technology, Inc., San Jose, Calif.

[*] Notice: This patent is subject to a terminal disclaimer.

[21] Appl. No.: 08/995,650

[22] Filed: Dec. 22, 1997

[51] Int. Cl.[7] .............................................. H01L 21/4763
[52] U.S. Cl. .................... 438/619; 438/622; 438/659; 438/705; 438/745; 438/754
[58] Field of Search .................... 438/619, 622, 438/659, 705, 745, 754

[56] References Cited

U.S. PATENT DOCUMENTS

| | | | |
|---|---|---|---|
| 4,665,610 | 5/1987 | Barth | 29/580 |
| 4,668,335 | 5/1987 | Mockler et al. | 156/643 |
| 4,906,586 | 3/1990 | Blackburn | 437/40 |
| 5,024,747 | 6/1991 | Turner et al. | 204/298.09 |
| 5,134,085 | 7/1992 | Gilgen et al.. | 437/52 |
| 5,244,534 | 9/1993 | Yu et al. | 156/636 |
| 5,281,320 | 1/1994 | Turner et al. | 204/298.15 |
| 5,793,105 | 8/1998 | Pace | 257/700 |
| 5,808,210 | 9/1998 | Herb et al. | 73/862.59 |

OTHER PUBLICATIONS

S. Wolf, Ph.D. and R. Tauber, Ph.D., *"Silicon Processing for the VLSI Era"*, vol. 1: Process Technology, Lattice Press, Sunset Beach, CA, pp. 1–650.

S.T. Cho, K. Najafi, C.L. Lowman and K.D. Wise, *"An Ultrasensitive Silicon Pressure–Based Flowmeter"*, 1989 IEEE, Center for Integrated Sensors and Circuits, Dept. of Electrical Engineering and Computer Science, University of Michigan, Ann Arbor, MI.

*Primary Examiner*—Jey Tsai
*Assistant Examiner*—David A. Zarneke
*Attorney, Agent, or Firm*—Martine Penilla & Kim, LLP

[57] ABSTRACT

Disclosed is a method for making a programmable structure on a semiconductor substrate. The semiconductor structure has a first dielectric layer. The method includes plasma patterning a first metallization layer over the first dielectric layer. Forming a second dielectric layer over the first metallization layer and the first dielectric layer. Forming a plurality of tungsten plugs in the second dielectric layer. Each of the plurality of tungsten plugs are in electrical contact with the first metallization layer. Plasma patterning a second metallization layer over the second dielectric layer and the plurality of tungsten plugs, such that at least a gap over each of the tungsten plugs is not covered by the second metallization layer. Applying a programming electron dose to a portion of the second metallization layer. The method further includes submersing the semiconductor substrate into a basic solution to remove each of the plurality of tungsten plugs except for a tungsten plug that is in electrical contact with the portion of the second metallization layer that received the applied programming electron dose.

21 Claims, 7 Drawing Sheets

PROGRAMMABLE SEMICONDUCTOR STRUCTURES AND METHODS FOR MAKING THE SAME

CROSS REFERENCE TO RELATED APPLICATIONS

This application is related to the following US patent application having Ser. No. 08/995,500 (attorney docket no. VTI1P181), filed on the same day as the instant application, and entitled "Semiconductor Pressure Transducer Structures and Methods for Making the Same." This application is hereby incorporated by reference.

BACKGROUND OF THE INVENTION

1. Field of the Invention

The present invention relates generally to integrated circuits and, more particularly, to programmable semiconductor structures and methods for efficiently fabrication the same.

2. Description of the Related Art

There are a significant number of integrated circuit applications that require some sort of electrically programmable memory for storing information. The information stored varies widely in size ranging from a few bits used to program simple identification data, to several megabits used to program computer operating code. To accommodate the increased demand for electrically programmable memory in modern integrated circuits, a number of well known memory technologies are commonly used. Some example memory technologies include programmable read only memories (PROMs), erasable programmable read-only memories (EPROMs), electrically erasable programmable read-only memories (EEPROMs), field programmable gate arrays (FPGAs), fuse devices, antifuse devices, etc.

By way of example, FIG. 1 shows a semiconductor chip 100 that incorporates programmable memory 102. The programmable memory 102 will generally include memory devices 102a that may be programmably coupled to various control circuits that are part of the core CMOS circuitry that lies in the semiconductor chip 100. Although the programmable memory 102 works well, semi-custom fabrication is generally needed to manufacture and integrate the memory devices in conjunction with the core CMOS circuitry. Consequently, this type of integration will tend to be costly. In addition, the turn around time to complete this type of integration will also be higher than semiconductor chips that do not have programmable devices integrated therein. Furthermore, the additional product costs are often times difficult to justify when only a relatively small amount of electrically programmable elements are needed for a particular integrated circuit application.

In view of the foregoing, there is a need for programmable devices that can be cost effectively fabricated and programmed along with other standard CMOS circuitry.

SUMMARY OF THE INVENTION

Broadly speaking, the present invention fills these needs by providing programmable devices that are fabricated and programmed using standard CMOS fabrication operations. It should be appreciated that the present invention can be implemented in numerous ways, including as a process, an apparatus, a system, a device, or a method. Several inventive embodiments of the present invention are described below.

In one embodiment, a method for making a programmable structure on a semiconductor substrate is disclosed. The semiconductor structure has a first dielectric layer. The method includes plasma patterning a first metallization layer over the first dielectric layer. Forming a second dielectric layer over the first metallization layer and the first dielectric layer. Forming a plurality of tungsten plugs in the second dielectric layer. Each of the plurality of tungsten plugs are in electrical contact with the first metallization layer. Plasma patterning a second metallization layer over the second dielectric layer and the plurality of tungsten plugs, such that at least a gap over each of the tungsten plugs is not covered by the second metallization layer. Applying a programming electron dose to a portion of the second metallization layer. The method further includes submersing the semiconductor substrate into a basic solution to remove each of the plurality of tungsten plugs except for a tungsten plug that is in electrical contact with the portion of the second metallization layer that received the applied programming electron dose.

In another embodiment, a method for fabricating programmable structures on a semiconductor substrate is disclosed. The method includes performing a plasma etch of a lower metallization layer that lies over a first dielectric layer that is deposited over the semiconductor substrate, so that a first lower metallization feature and a second lower metallization feature remain over the first dielectric layer. Depositing a second dielectric layer over the first lower metallization feature, the second lower metallization feature, and the first dielectric layer. Forming a first tungsten plug and a second tungsten plug in the second dielectric layer. The first tungsten plug is in electrical contact with the first lower metallization feature and the second tungsten plug is in electrical contact with the second lower metallization feature. Performing a plasma etch of an upper metallization layer that lies over the second dielectric layer, so that a first upper metallization feature and a second upper metallization feature are respectively in electrical contact with the first tungsten plug and the second tungsten plug. Applying a dose of electrons to the first upper metallization feature. The method further includes submersing the semiconductor substrate in a basic solution until second tungsten plug is eroded, while the first tungsten plug remains.

In yet another embodiment, a method for fabricating programmable structures on a semiconductor substrate is disclosed. The semiconductor substrate has a lower network of metallization features and an upper network of metallization features that are patterned in a plasma etching chamber. The semiconductor substrate also has a network of tungsten plugs interconnecting the lower network of metallization features to the upper network of metallization features. The method includes directing a programmable dose of electrons to selected ones of the upper network of metallization features. The method further includes submersing the semiconductor substrate in a basic solution that causes all of the tungsten plugs that were not directed with the programmable does of electrons to completely dissolve in the basic solution.

In still a further embodiment, an apparatus for fabricating programmable structures on a semiconductor substrate is disclosed. The semiconductor substrate has a lower network of metallization features and an upper network of metallization features that are patterned in a plasma etching chamber. The semiconductor substrate also has a network of tungsten plugs interconnecting the lower network of metallization features to the upper network of metallization features. The apparatus includes means for directing a programmable dose of electrons to selected ones of the upper network of metallization features. The apparatus further includes means for submersing the semiconductor substrate in a basic solution that causes all of the tungsten plugs that were not directed with the programmable dose of electrons to completely dissolve in the basic solution.

One advantage of the present invention is that programmable structures can be fabricated and programmed along with the fabrication of standard CMOS interconnect structures. Further yet, the compact nature of the present programmable structures enables the fabrication of very compact programmable cells that can be integrated in many different types of application specific integrated circuits (ASICs). By way of example, the programmable structures of the present invention may be used in any application that traditionally uses fuse technology or other programmable cell technology. Further yet, the programmable structures can be implemented in many types of consumer electronics that use programmable cells (i.e., such as fuse and antifuse) to store confidential information, such as pin numbers, bank account numbers, social security numbers and other confidential information directly on a chip. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for programmable devices that are fabricated and programmed using standard CMOS fabrication operations is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
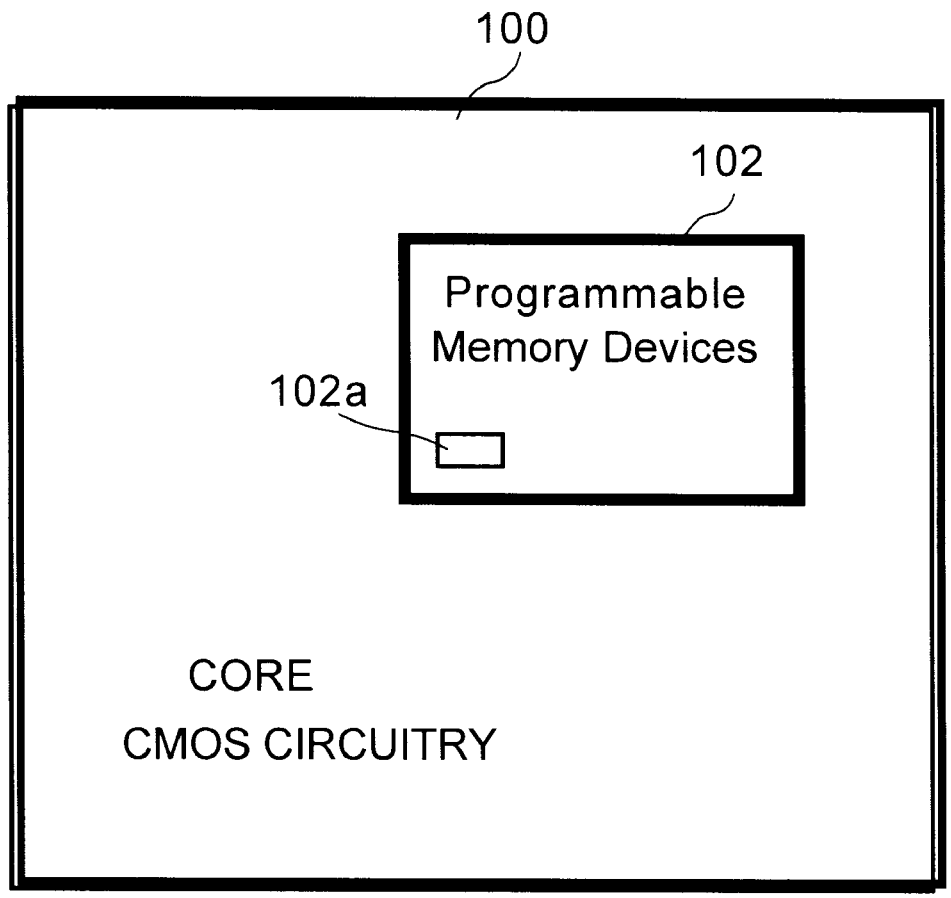
FIG. 1 shows a semiconductor chip that incorporates semi-custom fabricated programmable memory devices.
Figure 2:
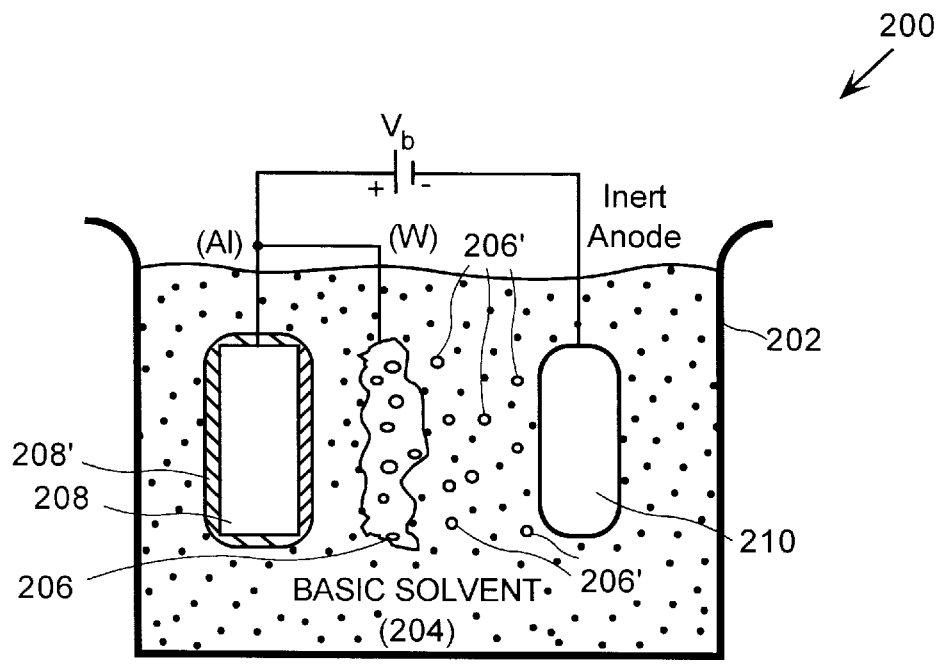
FIG. 2 shows a chemical reaction system having an aluminum electrode and a tungsten electrode submerged in a basic solution in accordance with one embodiment of the present invention.

FIG. 2 shows a chemical reaction system 200 having an aluminum electrode 208 and a tungsten electrode 206 submerged in a basic solution 204 in accordance with one embodiment of the present invention. In this example, both the aluminum electrode 208 and the tungsten electrode 206 are coupled to a positive bias voltage $V_b$, and a negative electrode 210 is coupled to a negative terminal of the bias voltage $V_b$. The basic solvent 204 is preferably an electrolyte that preferably has a pH level that is greater than about 7, and more preferably is greater than about 8, and most preferably is greater than about 10.

Although a chemical reaction between the aluminum electrode 208 and the basic solvent 204, and the tungsten electrode 206 and the basic solvent 204 will naturally occur without the application of a bias voltage $V_b$, the chemical reaction in the basic solvent 204 may be accelerated by applying the bias voltage $V_b$. For example, when the bias voltage $V_b$ is applied between the two electrodes, the tungsten electrode 206 will rapidly begin to erode by reacting with the basic solvent 204. This reaction produces tungsten oxide $WO_3$ 206' which rapidly dissolves in lightly basic solutions. Once the reaction begins, the tungsten will continue to oxidize until the tungsten electrode 206 is completely eroded.

In contrast however, the aluminum electrode 208 will not erode in the basic solvent 204, but will form an aluminum oxide passivation layer 208'. Because standard CMOS circuit fabrication processes utilize aluminum interconnect lines, and tungsten plugs to interconnect the aluminum lines of the various levels, it is possible to simultaneously manufacture a programmable device during the standard CMOS circuit fabrication process.

By way of example, when an interconnect layer is designed, a programmable device may be simultaneously designed into that layer by allowing a portion of a tungsten plug to be exposed, before the semiconductor substrate (i.e., the wafer) is submerged into a basic solvent that is commonly used to remove polymers after a metallization etching operation. An embodiment of this technique will now be described in greater detail with reference to FIGS. 3A through 3F.

Figure 3A:
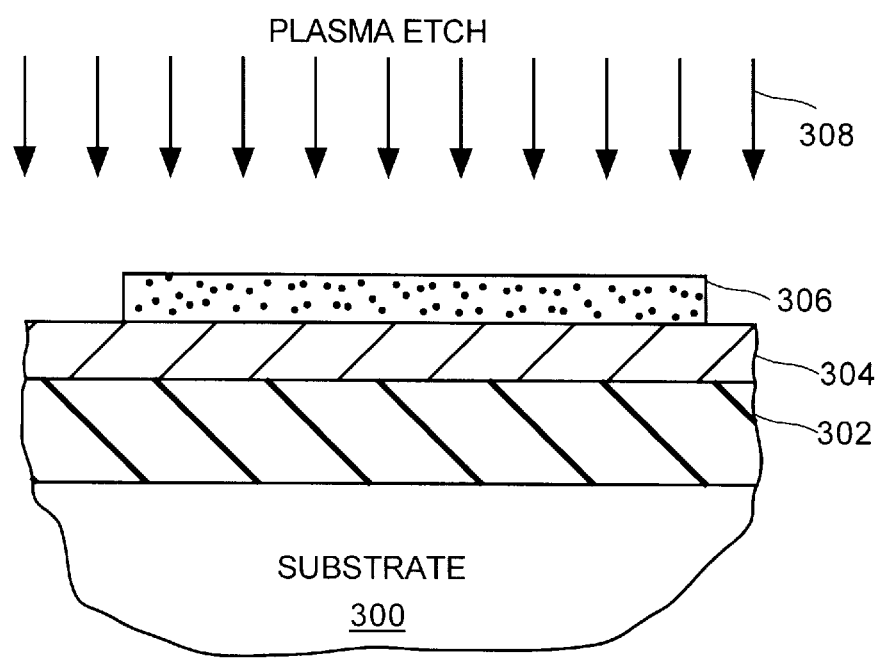
FIG. 3A shows a cross-sectional view of a partially fabricated semiconductor structure that is formed over a substrate in accordance with one embodiment of the present invention.

FIG. 3A shows a cross-sectional view of a partially fabricated semiconductor structure that is formed over a substrate 300 in accordance with one embodiment of the present invention. In an initial operation, an inter-metal oxide 302 is formed over the substrate 300, and then a metallization layer 304 is sputtered over the inter-metal oxide layer 302. In order to pattern the metallization layer 304, a photoresist mask 306 is formed over the metallization layer 304. As is well known, the photoresist mask 306 may be patterned using any number of well known techniques, including conventional photolithography.

Once the photoresist mask 306 has been formed, a plasma etching operation 308 is performed to remove the metallization layer 304 that is not covered by the photoresist mask 306. Although any plasma etcher may be used, one exemplary plasma etcher is a Lam Research TCP 9600 SE etcher, that is available from Lam Research of Fremont, Calif. In this embodiment, the plasma etcher is configured to negatively charge the substrate 300 to a negative potential (−), and the metallization layers that are not electrically connected to the substrate 300 (i.e., through conductive via structures), to a positive potential (+).

Figure 3B:
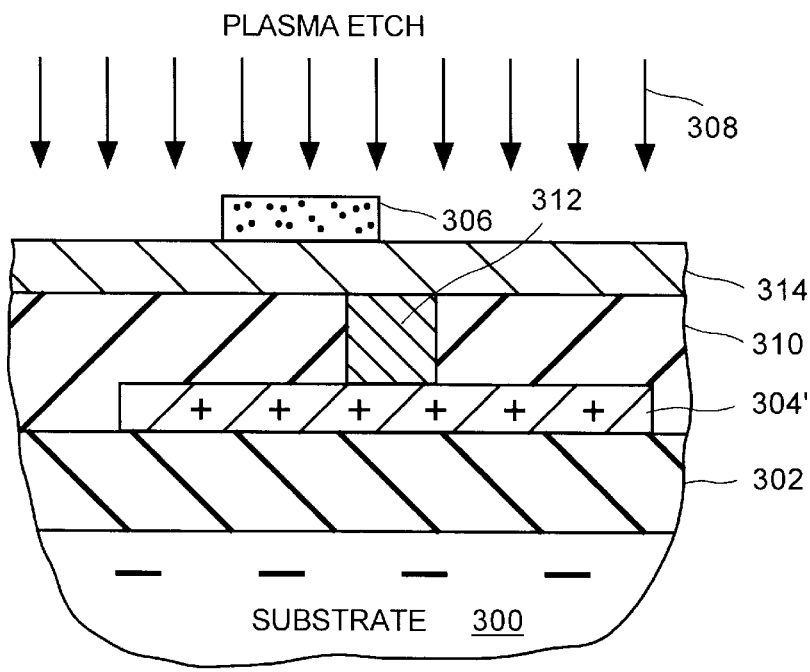
FIG. 3B shows a cross-sectional view of the semiconductor structure of FIG. 3A after a number of layers are fabricated over an inter-metal oxide layer and a patterned metallization layer in accordance with one embodiment of the present invention.

FIG. 3B shows a cross-sectional view of the semiconductor structure of FIG. 3A after a number of layers are fabricated over the inter-metal oxide layer 302 and a patterned metallization layer 304' in accordance with one embodiment of the present invention. As pictorially shown, the patterned metallization layer 304' was charged to a positive (+) potential, and is a floating structure that is not connected to a diffusion or gate of the substrate 300. In this example, an inter-metal oxide layer 310 was formed over the patterned metallization layer 304', and a tungsten plug 312 was formed within a via that was etched into the inter-metal oxide layer 310.

After the tungsten plug 312 is formed into the inter-metal oxide layer 310, a metallization layer 314 is sputtered over the inter-metal oxide layer 310 and the tungsten plug 312. In order to pattern the metallization layer 314, a photoresist mask 306 is patterned over the metallization layer 314. In this embodiment, the photoresist mask 306 is patterned such that at least a portion of the tungsten plug 312 is exposed once the metallization layer 314 is etched. Therefore, once the plasma etch operation 308 is performed, the structure of FIG. 3C will result. As shown, a patterned metallization layer 314' will now lie over the inter-metal oxide layer 310, and over substantially all of the tungsten plug 312. However, at least one gap 320 of any suitable size or shape will expose a portion of the underlying tungsten plug 312. After the etching operations are complete, a charge "Q" that is equivalent to the capacitance "C" of the patterned metallization layers 304' and 314' multiplied by the induced plasma voltage during the plasma etching of the metal is produced (i.e., Q=C*V).

Figure 3C:
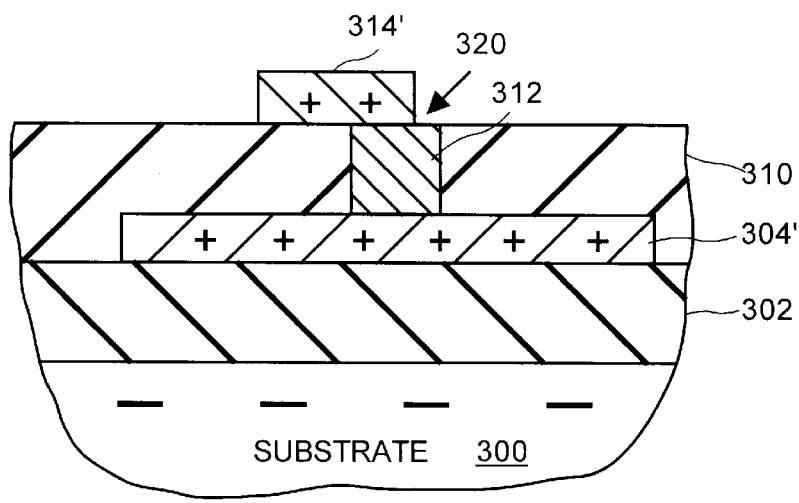
FIG. 3C shows the cross-sectional view of FIG. 3B after a top metallization layer is etched in a plasma etcher in accordance with one embodiment of the present invention.
Figure 3D:
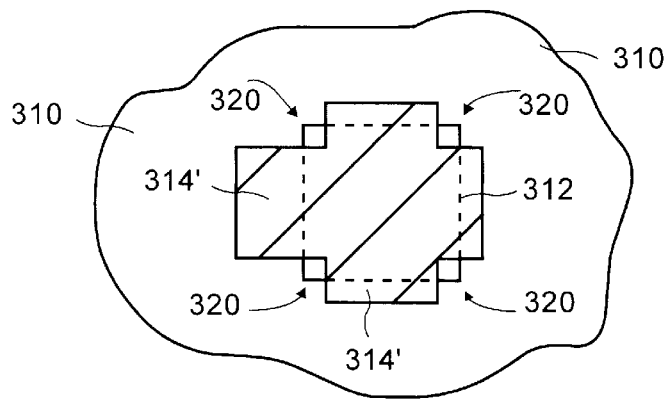
FIG. 3D shows a top view of the structure of FIG. 3C in accordance with one embodiment of the present invention.

FIG. 3D shows a top view of the structure of FIG. 3C in accordance with one embodiment of the present invention. As shown, the patterned metallization layer 314' is patterned such that at least one gap 320 exposes the underlying tungsten plug 312 material. As mentioned above, it is important that at least a portion of the tungsten plug 312 is able to achieve contact with the basic solvent 204, which will advantageously cause the tungsten material of the tungsten plug 312 to erode out of the via hole.

Figure 3E:
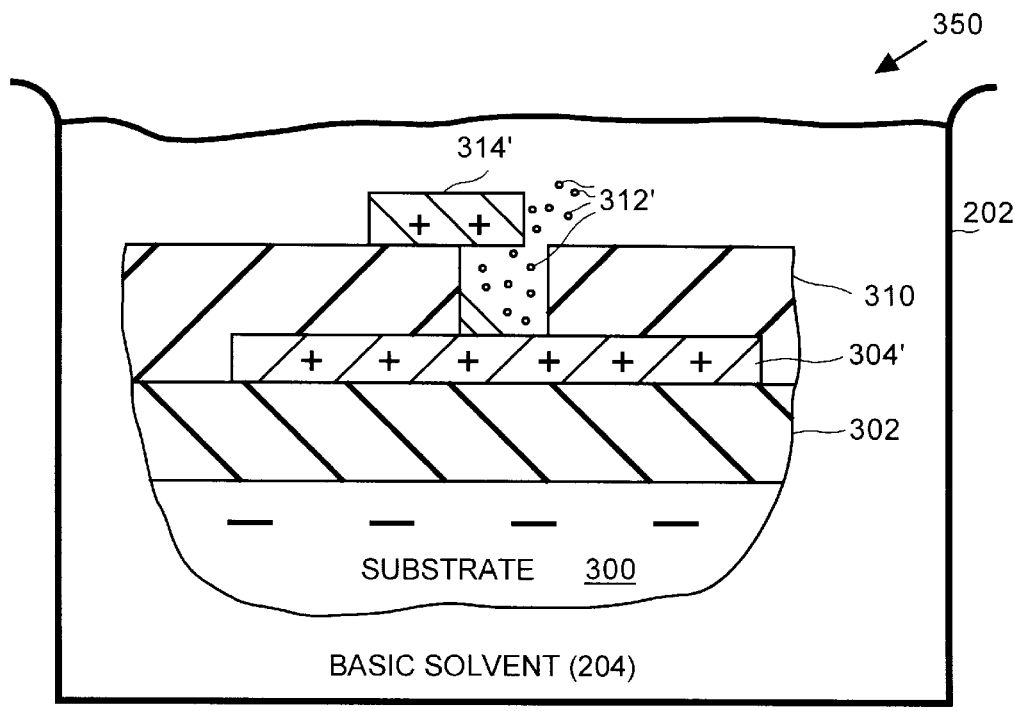
FIG. 3E shows a polymer removal system for submerging a fabricated substrate in a basic solvent in accordance with one embodiment of the present invention.

FIG. 3E shows a polymer removal system 350, where a fabricated substrate 300 is submerged in a basic solvent 204 in accordance with one embodiment of the present invention. Because the fabricated substrate 300 is usually submerged in a container 202 that contains the basic solvent 204 during standard CMOS polymer removal operations, it is advantageously possible to simultaneously fabricate programmable devices during these operations. That is, the polymer removal system 350 is generally used as a standard operation after a plasma operation, and therefore, by strategically patterning metallization materials over selected tungsten plugs, it will be possible to densely integrate programmable devices in densely integrated CMOS circuits. As will be described in greater detail below, if a programming scheme requires that a selected tungsten plug remain intact after the submersion operation, an e-beam scanning system may be used to target the metallization pattern that overlies the selected tungsten plug. In this manner, the metallization pattern will be neutralized, and the tungsten material will no longer react in the basic solution.

However, it will be assumed that all programmable structures will have a lower metallization layer that is not coupled to the negatively charged substrate 300 so that all tungsten plugs are allowed to erode if the e-beam system is not used to neutralize the selected metallization patterns that overlie tungsten plugs.

In this example, because the patterned metallization layer 314' and the patterned metallization layer 304' are not in electrical contact with the substrate 300 that is negatively charged, the chemical reaction described with reference to FIG. 2 will naturally occur. In one embodiment, the erosion of the tungsten material will generally occur so long as the charge Q of the metal capacitor divided by $1.6 \times 10^{-19}$ is greater than the number of tungsten atoms in the via plug (i.e., $Q/1.6 \times 10^{-19} > W$ atoms in plug).

Accordingly, for those tungsten plugs that have not been neutralized, the tungsten plug material 312 will immediately begin to erode and be converted to tungsten oxide ions 314' that dissolve in the basic solution. Therefore, in this example, the tungsten plug material 312 will be completely removed, thereby creating a clean via hole that will represent a true open circuit. In fact, because the tungsten material is completely eroded away, there will be no concern of "accidental" de-programming as is known to happen in some programmable fuse or antifuse devices. Therefore, the programming achieved by this process will be substantially more reliable than commonly used programmable devices.

Figure 3F:
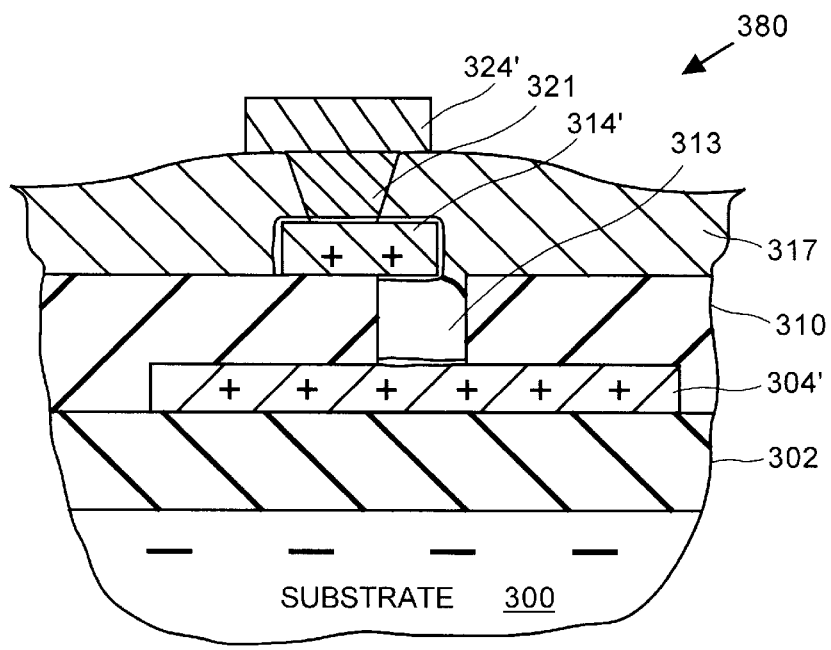
FIG. 3F shows a cross-sectional view of a programmable structure in accordance with one embodiment of the present invention.

FIG. 3F shows a cross-sectional view of a programmed structure 380 in accordance with one embodiment of the present invention. During the submersion into the basic solvent 204, the entire tungsten plug 312 was removed, thereby leaving a via hole 313. However, the exposed patterned metallization layers 304' and 314' will build up an aluminum oxide passivation layer 315. To complete the programmed structure 380, an inter-metal oxide layer 317 is deposited over the inter-metal oxide layer 310 and the patterned metallization layer 314' to seal off the via hole 313.

A conductive via 321 may then be formed over the patterned metallization layer 314', and a patterned metallization layer 324' is formed over the conductive via 321. In this manner, no electrical contact will be established between the patterned metallization layer 324' and the patterned metallization layer 304'. Of course, if the patterned metallization layer 314' had been neutralized by an e-beam system, then the tungsten plug 312 would not have been removed during the submersion into the basic solution.

Figure 4A:
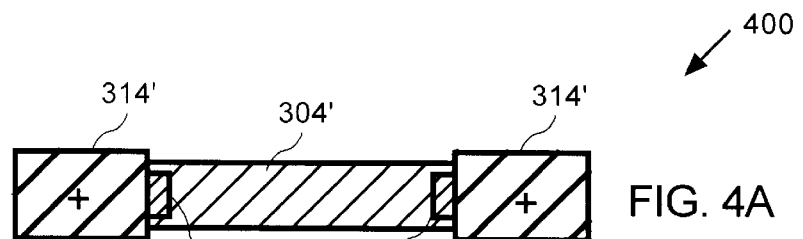
FIG. 4A shows a top view of a programmable structure in accordance with one embodiment of the present invention.
Figure 4B:
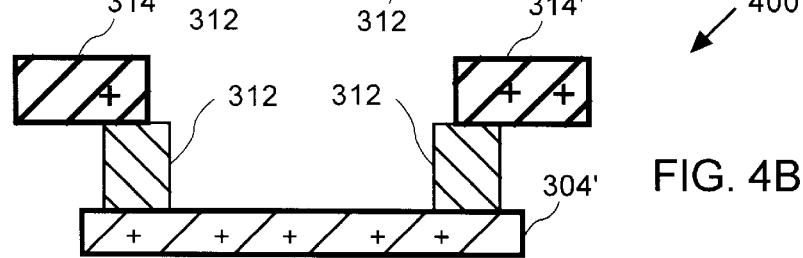
FIG. 4B is a cross-sectional view of the programmable structure of FIG. 4A in accordance with one embodiment of the present invention.

FIG. 4A shows a top view of a programmable structure 400 in accordance with one embodiment of the present invention. In this view, the patterned metallization layer 304' is shown interconnected to the patterned metallization layer 314' through tungsten plugs 312. FIG. 4B is a cross-sectional view of the programmable structure 400 that illustrates the interconnection between the patterned metallization layers 314' and the patterned metallization layer 304'.

As mentioned above, when the patterned metallization layers 304' and 314' were etched in a plasma etching system, the respective metallization lines became positively charged. Of course, if other metallization lines were connected to the substrate through a conductive via, then those patterned metallization lines would be negatively charged. At this stage, the electrical connection between the two features of the patterned metallization 314' is through the tungsten plugs 312 and the patterned metallization layer 304'. As defined herein, this programmable structure 400 is in a "non-programmed" state, because the tungsten plugs 312 will erode once the substrate is submerged.

Figure 5:
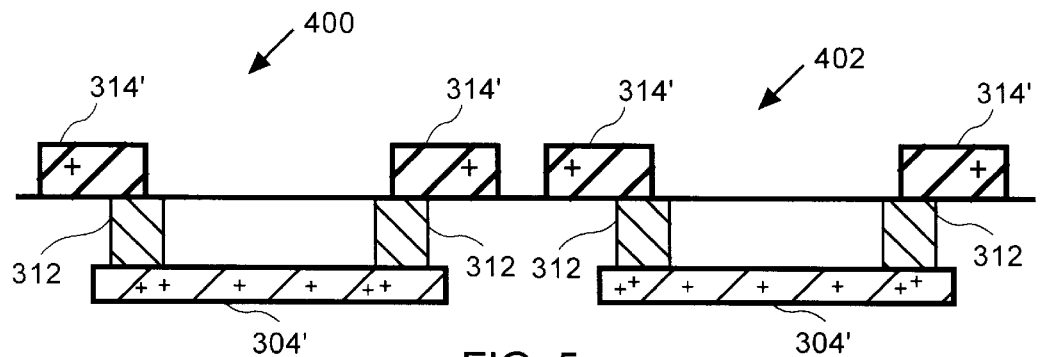
FIG. 5 shows a cross-sectional view of a pair of programmable structures that may be formed over any location of a semiconductor substrate in accordance with one embodiment of the present invention.

FIG. 5 shows a cross-sectional view of a pair of programmable structures 400 and 402 which may be formed over any location of a semiconductor substrate in accordance with one embodiment of the present invention. For sake of clarity, the substrate cross-sectional view, including the inter-metal oxides that lie between the patterned metallization layer 304' and 314' are not shown. However, it should be noted that each of the patterned metallization layers are positively charged due to the above described plasma etching operation. It is further noted that the patterned metallization layer 314' provides a sufficient opening down to the tungsten plugs 312, so that the tungsten plugs 312 are able to gain contact with the basic solution once the substrate is submerged as described above.

Figure 6:
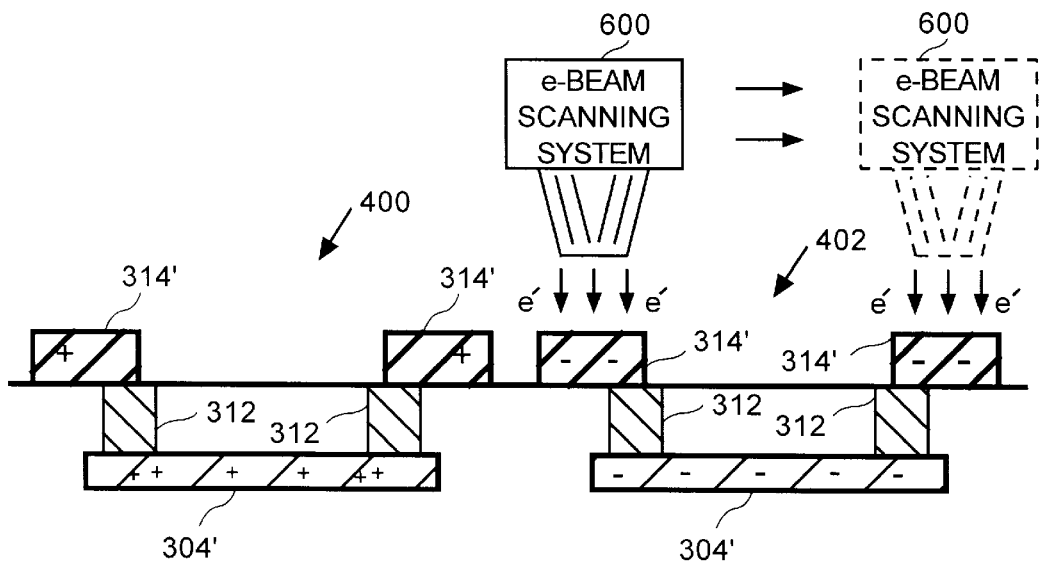
FIG. 6 shows an e-beam scanning system that is used to direct electrons to selected features of a patterned metallization layer in accordance with one embodiment of the present invention.

In a programming operation, it may be desirable to form an open circuit between selected features of the patterned metallization layer 314' that is electrically interconnected through the tungsten plugs 312 and the underlying patterned metallization layer 304'. In one embodiment, an e-beam scanning system 600 may be used to selectively program the programmable structures 400 and 402. As shown in FIG. 6, the e-beam scanning system 600 is used to direct electrons to selected features of the patterned metallization layer 314'. In this example, the programming electrons are applied to the programmable structure 402.

In this manner, the positive charge in the patterned metallization layer 314' and 304' of the programmable structure 402 will be neutralized (i.e., the programmable structure 402 will be "programmed"), and caused it to have a slight negative charge. In contrast, the programmable structure 400 was not provided with an electron dose by the e-beam scanning system 600. As a result, the tungsten plugs 312 of the programmable structure 400 will completely erode away when the substrate containing the programmable structures 400 and 402 is submerged in the basic solution.

Figure 7:
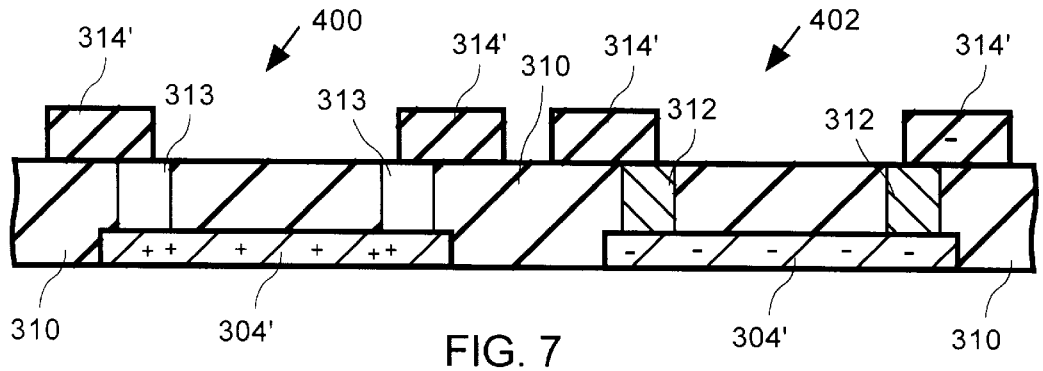
FIG. 7 shows a cross-sectional view of FIG. 6 after the substrate including the programmable devices, is submerged in the basic solution in accordance with one embodiment of the present invention.

FIG. 7 shows a cross-sectional view of FIG. 6 after the substrate including the programmable devices, is submerged in the basic solution in accordance with one embodiment of the present invention. As shown, after the substrate has been submerged in the basic solution, the tungsten plugs 312 that electrically interconnected the two features of the patterned metallization layer 314' were completely eroded (i.e., thereby producing a perfect open circuit).

In contrast, the programmable structure 402 has completely retained the tungsten plugs 312 because of the electron dose was provided to those selected features of the patterned metallization layer 314'. As can be appreciated, very compact programmable structures may be fabricated along with core CMOS semiconductor devices without the need for special fabrication operations. More specifically, the programming and fabrication of the programmable structures 400 and 402 can be performed in conjunction with normal fabrication operations that are used to manufacture standard interconnect structures.

Figure 8:
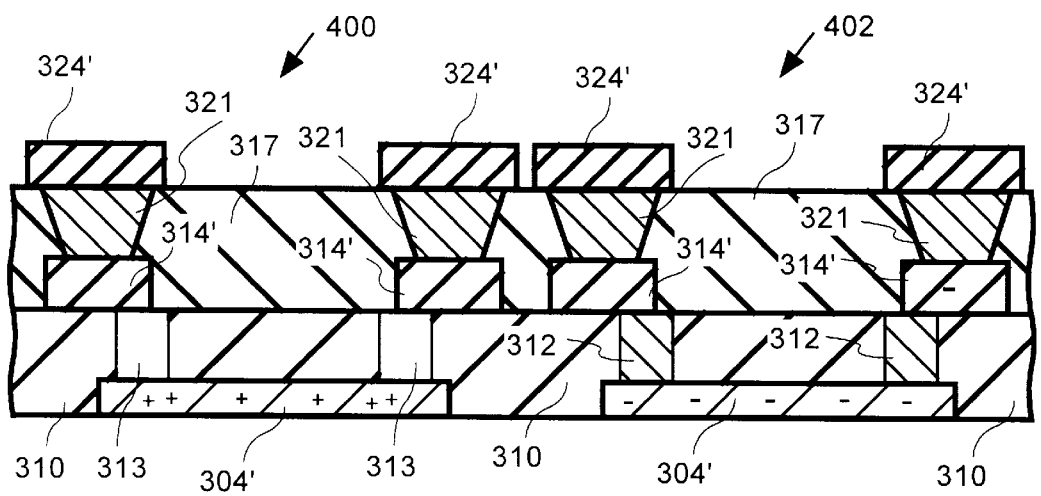
FIG. 8 shows the cross-sectional view of FIG. 7 after additional fabrication operations have been performed in accordance with one embodiment of the present invention.

FIG. 8 shows the cross-sectional view of FIG. 7 after additional fabrication operations have been performed in accordance with one embodiment of the present invention. As shown, an inter-metal oxide 317 was deposited over the patterned metallization layer 314' and the intermetal oxide 310. The inter-metal oxide 317 also seals off the via holes 313 of the programmed structure 400, and the tungsten plugs 312 of the programmable structure 402.

Also shown are tungsten plugs 321 which interconnect the patterned metallization layers 314' to the patterned metallization layers 324' that overlie the intermetal oxide 317. In this manner, the patterned metallization layer 324' may be used to route a circuit component to the programmed structure in accordance with a given programming scheme. As mentioned above, the electrical interconnection between the two features of the patterned metallization layers 324' (of the programmable structure 400) is no longer present because the tungsten plugs 312 were removed when the substrate was submerged in the basic solution. However, the tungsten plugs 312 still remain in the programmable structure 402 because the e-beam scanning system 600 selectively applied a dose of electrons to the features of the patterned metallization layer 314' (which caused the neutralization of those metallization features).

Figure 9:
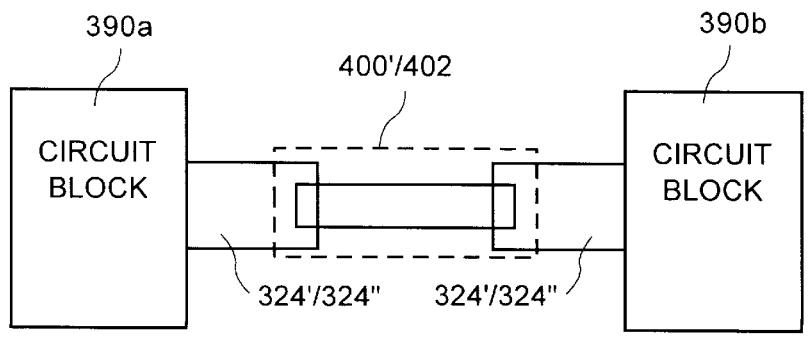
FIG. 9 shows a top level system diagram in which a programmable structure is implemented in accordance with one embodiment of the present invention.

FIG. 9 shows a top level system diagram in which a programmable structure 400 or 402 is implemented in accordance with one embodiment of the present invention. In this example, if an electrical connection is desired between a circuit block 390$a$ and a circuit block 390$b$, the programmable structure should be exposed to an electron dose to neutralize selected features of the patterned metallization layer 314', and thereby prevent the tungsten plugs 312 from eroding during the submersion operation. Alternatively, if the connection between the circuit block 390$a$ and 390$b$ is not desired in a particular application, the e-beam scanning system 600 would not apply the electron dose to those metallization features that overly those selected tungsten plugs 312.

Figure 10:
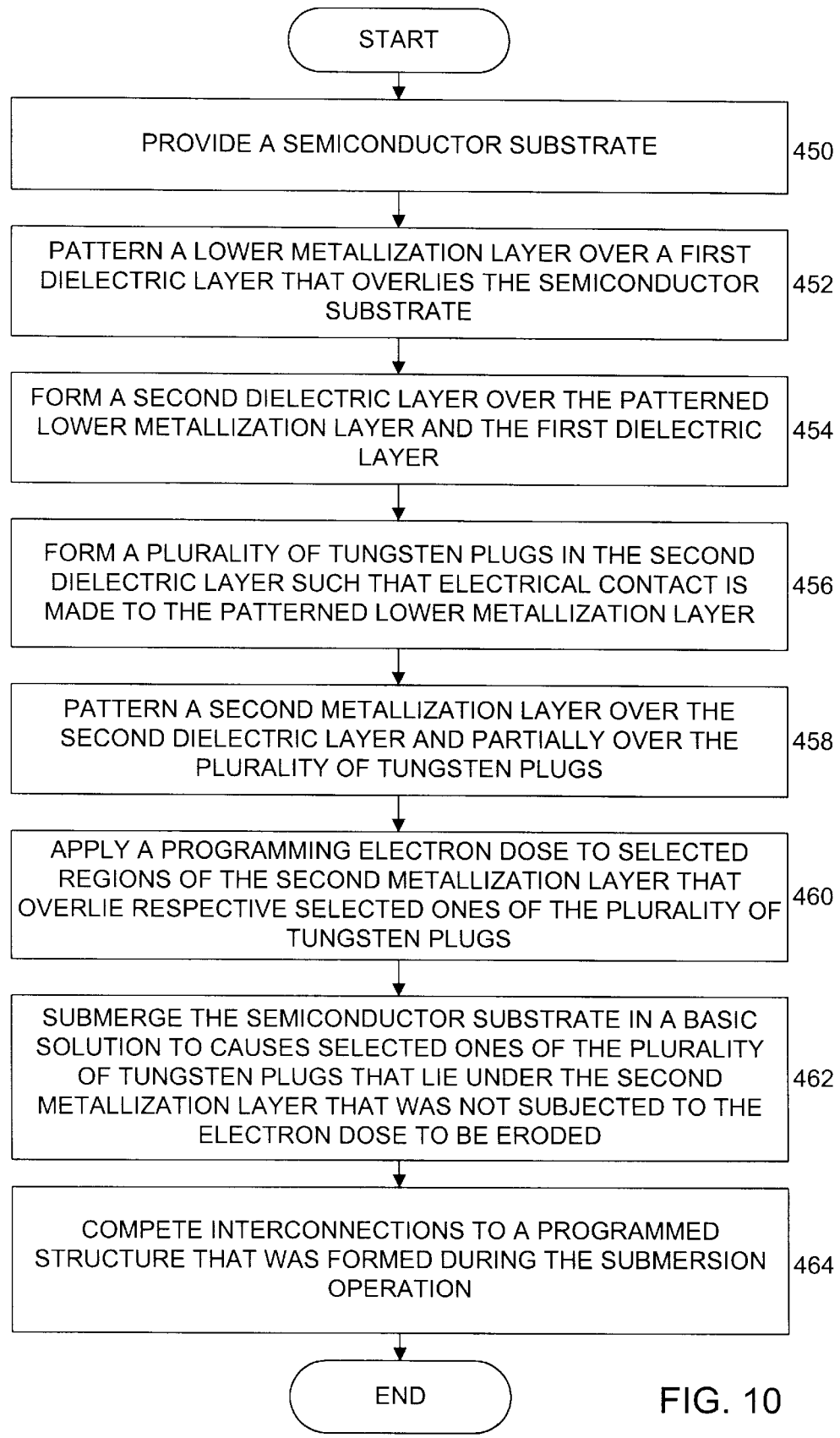
FIG. 10 is a flowchart diagram illustrating the preferred method operations used in fabricating programmable structures in accordance with one embodiment of the present invention.

FIG. 10 is a flowchart diagram illustrating the preferred method operations used in fabricating programmable structures in accordance with one embodiment of the present invention. The method begins at an operation 450 where a semiconductor substrate is provided. In general, the semiconductor substrate may be any substrate that may benefit from a programmable structure that can be simultaneously programmed along with standard interconnect structures. The method then proceeds to an operation 452 where a lower metallization layer is patterned over a first dielectric layer that overlies the semiconductor substrate. Once the lower metallization layer has been patterned, the method will proceed to an operation 454 where a second dielectric layer is formed over the patterned lower metallization layer and the first dielectric layer. After the second dielectric layer has been formed, the method will proceed to an operation 456.

In operation 456, a plurality of tungsten plugs are formed into the second dielectric layer such that electrical contact is made with the patterned lower metallization layer. Next, a second metallization layer is patterned over the second dielectric layer and partially over the plurality of tungsten plugs. As mentioned above with reference to FIG. 3D, the second metallization layer will expose at least a portion of the underlying tungsten plugs.

The method will then proceed to an operation 460 where a programmable electron dose is applied to selected regions of the second metallization layer. In this manner, the selected regions of the second metallization layer correspond to selected ones of the plurality of tungsten plugs. By applying the programmable electron dose to those selected regions of the second metallization layer, it is possible to neutralize those metallization regions to prevent the tungsten material from eroding during a subsequent operation.

Once the selected regions of the second metallization layer have been provided with the programming electron dose, the method will proceed to an operation 462. In operation 462, the semiconductor substrate is submerged in a basic solution to cause selected ones of the plurality of tungsten plugs that lie under the second metallization layer that was not subjected to the electron dose to be eroded. In other words, only those tungsten plugs that were provided with the electron dose will remain after the wafer is submerged in the basic solution, and those that were not subjected to the programming electron dose will be removed.

The method will then proceed to an operation 464 where the remaining interconnections to a programmed structure that was formed during the submersion operation is completed, and the method will end. As can be appreciated, the programmable structures have been fabricated simultaneously with the formation of interconnect structures that are commonly fabricated in CMOS integrated circuits. This is a substantial improvement in that no additional fabrication operations are required to custom fabricate programmable devices into densely integrated CMOS devices.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making a programmable structure on a semiconductor substrate having a first dielectric layer, comprising:

plasma patterning a first metallization layer over the first dielectric layer;

forming a second dielectric layer over the first metallization layer and the first dielectric layer;

forming a plurality of tungsten plugs in the second dielectric layer, such that each of the plurality of tungsten plugs are in electrical contact with the first metallization layer;

plasma patterning a second metallization layer over the second dielectric layer and the plurality of tungsten plugs, such that at least a gap over each of the tungsten plugs is not covered by the second metallization layer;

applying a programming electron dose to a portion of the second metallization layer; and submersing the semiconductor substrate into a basic solution to remove each of the plurality of tungsten plugs except for a tungsten plug that is in electrical contact with the portion of the second metallization layer that received the applied programming electron dose.

2. A method for making a programmable structure on a semiconductor substrate as recited in claim 1, wherein the basic solution has a pH level that is at least about greater than 7.

3. A method for making a programmable structure on a semiconductor substrate as recited in claim 2, further comprising:

inducing a positive charge onto the first metallization layer and the second metallization layer during the plasma patterning.

4. A method for making a programmable structure on a semiconductor substrate as recited in claim 3, further comprising:

inducing a negative charge onto the semiconductor substrate during the plasma patterning.

5. A method for making a programmable structure on a semiconductor substrate as recited in claim 4, wherein the programming electron dose that is applied to the portion of the second metallization layer is configured remove the positive charge that was induced by the plasma patterning.

6. A method for making a programmable structure on a semiconductor substrate as recited in claim 5, wherein an open circuit is produced between the first metallization layer and the second metallization layer when the plurality of tungsten plugs are removed.

7. A method for making a programmable structure on a semiconductor substrate as recited in claim 5, wherein an electrical link is maintained between the portion of the second metallization layer and the first metallization layer through the tungsten plug that was not removed during the submersing.

8. A method for making a programmable structure on a semiconductor substrate as recited in claim 1, wherein an e-beam scanning system is used to apply the programming electron dose.

9. A method for making a programmable structure on a semiconductor substrate as recited in claim 1, further comprising:

fabricating a network of interconnect lines that electrically couple to the programmable structure.

10. A method for making a programmable structure on a semiconductor substrate as recited in claim 9, wherein the network of interconnect lines are fabricated along with a CMOS circuit.

11. A method for fabricating programmable structures on a semiconductor substrate, comprising:

performing a plasma etch of a lower metallization layer that lies over a first dielectric layer that is deposited over the semiconductor substrate, such that a first lower metallization feature and a second lower metallization feature remains over the first dielectric layer;

depositing a second dielectric layer over the first lower metallization feature, the second lower metallization feature and the first dielectric layer;

forming a first tungsten plug and a second tungsten plug in the second dielectric layer, such that the first tungsten plug is in electrical contact with the first lower metallization feature and the second tungsten plug is in electrical contact with the second lower metallization feature;

performing a plasma etch of an upper metallization layer that lies over the second dielectric layer, such that a first upper metallization feature and a second upper metallization feature are respectively in electrical contact with the first tungsten plug and the second tungsten plug;

applying a dose of electrons to the first upper metallization feature; and submersing the semiconductor substrate in a basic solution until second tungsten plug is eroded, while the first tungsten plug remains.

12. A method for fabricating programmable structures on a semiconductor substrate as recited in claim 11, wherein the first upper metallization feature and the second upper metallization feature do not completely cover the first tungsten plug and the second tungsten plug.

13. A method for fabricating programmable structures on a semiconductor substrate as recited in claim 12, wherein the first lower metallization feature and the second lower metallization feature are not in electrical contact with the semiconductor substrate.

14. A method for fabricating programmable structures on a semiconductor substrate as recited in claim 11, wherein the first lower metallization feature, the second lower metallization feature, the first upper metallization feature, and the second upper metallization feature are positively charged during the plasma etch.

15. A method for fabricating programmable structures on a semiconductor substrate as recited in claim 14, wherein the semiconductor substrate is negatively charged during the plasma etch.

16. A method for fabricating programmable structures on a semiconductor substrate as recited in claim 11, wherein when the second tungsten plug is eroded, the second tungsten plug oxides and dissolves in the basic solution.

17. A method for fabricating programmable structures on a semiconductor substrate as recited in claim 16, wherein the basic solution has a pH that is at least greater than 7.

18. A method for fabricating programmable structures on a semiconductor substrate as recited in claim 17, wherein the applying of the dose of electrons is configured to programmably interconnect at least a first circuit block and a second circuit block.

19. A method for fabricating programmable structures on a semiconductor substrate as recited in claim 18, wherein the programmable structures are fabricated along with a plurality of CMOS interconnect structures.

20. A method for fabricating programmable structures on a semiconductor substrate, the semiconductor substrate having a lower network of metallization features and an upper network of metallization features that are patterned in a plasma etching chamber, and a network of tungsten plugs interconnecting the lower network of metallization features to the upper network of metallization features, the method comprising:

directing a programmable dose of electrons to selected ones of the upper network of metallization features; and submersing the semiconductor substrate in a basic solution that causes all of the tungsten plugs that were not directed with the programmable dose of electrons to completely dissolve in the basic solution.

21. A method for fabricating programmable structures on a semiconductor substrate as recited in claim 20, wherein the basic solution has a pH level that is at least greater than 7.

* * * * *